United States Patent
Kim et al.

(10) Patent No.: US 9,252,220 B2
(45) Date of Patent: Feb. 2, 2016

(54) NITRIDE SEMICONDUCTOR DEVICE AND FABRICATING METHOD THEREOF

(71) Applicant: LG ELECTRONICS INC., Seoul (KR)

(72) Inventors: Junho Kim, Seoul (KR); Seongmoo Cho, Seoul (KR); Taehoon Jang, Seoul (KR); Eujin Hwang, Seoul (KR); Jaemoo Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/589,730

(22) Filed: Jan. 5, 2015

(65) Prior Publication Data
US 2015/0200257 A1    Jul. 16, 2015

(30) Foreign Application Priority Data
Jan. 16, 2014    (KR) .................. 10-2014-0005705

(51) Int. Cl.
*H01L 29/20*    (2006.01)
*H01L 29/36*    (2006.01)
*H01L 29/205*    (2006.01)
*H01L 29/778*    (2006.01)
*H01L 21/02*    (2006.01)
(Continued)

(52) U.S. Cl.
CPC .......... *H01L 29/205* (2013.01); *H01L 21/0254* (2013.01); *H01L 21/0262* (2013.01); *H01L 21/02458* (2013.01); *H01L 21/02488* (2013.01); *H01L 21/02631* (2013.01); *H01L 29/201* (2013.01); *H01L 29/2003* (2013.01); *H01L 29/778* (2013.01); *H01L 29/7783* (2013.01); *H01L 29/7786* (2013.01); *H01L 29/207* (2013.01)

(58) Field of Classification Search
None
See application file for complete search history.

(56) References Cited

U.S. PATENT DOCUMENTS

2009/0045438 A1*  2/2009  Inoue et al. .................. 257/192
2011/0006308 A1    1/2011  Sato
(Continued)

FOREIGN PATENT DOCUMENTS

| EP | 2767620 A1 * | 8/2014 |
| JP | 2009-260296 A | 11/2009 |
| JP | 2011-18844 A | 1/2011 |

(Continued)

OTHER PUBLICATIONS

Follstaedt, D. M., S. R. Lee, A. A. Allerman, and J. A. Floro. "Strain Relaxation in AlGaN Multilayer Structures by Inclined Dislocations." J. Appl. Phys. Journal of Applied Physics 105.8 (2009): 083507.*

(Continued)

*Primary Examiner* — Joseph Schoenholtz
(74) *Attorney, Agent, or Firm* — Dentons US LLP

(57) ABSTRACT

A nitride semiconductor power device includes an AlGaN multilayer, which has changeable Al composition along a depositing direction, and $Si_xNy$ layer, so as to minimize an increase in a leakage current and a decrease in a breakdown voltage, which are caused while fabricating a heterojunction type HFET device. A semiconductor device includes a buffer layer, an AlGaN multilayer formed on the buffer layer, a GaN channel layer formed on the AlGaN multilayer, and an AlGaN barrier layer formed on the AlGaN multilayer, wherein aluminum (Al) composition of the AlGaN multilayer changes along a direction that the AlGaN multilayer is deposited.

8 Claims, 6 Drawing Sheets

(51) Int. Cl.
*H01L 29/201* (2006.01)
*H01L 29/207* (2006.01)

(56) References Cited

U.S. PATENT DOCUMENTS

| | | | |
|---|---|---|---|
| 2012/0153351 A1* | 6/2012 | Chandolu et al. | 257/192 |
| 2014/0094005 A1* | 4/2014 | Ramdani | 438/172 |

FOREIGN PATENT DOCUMENTS

| | | |
|---|---|---|
| JP | 2013-123047 A | 6/2013 |
| JP | 2013-206976 A | 10/2013 |
| WO | 2013/137476 A1 | 9/2013 |

OTHER PUBLICATIONS

'Modeling of High Voltage AlGaN/GaN HEMT', Crosslight Software Nov. 2013, downloaded from URL <http://crosslight.com/wp-content/uploads/2013/11/crosslight_High_Voltage_AlGaN_GaN_HEMT.pdf> on Jun. 9, 2015.*

Singisetti, Uttam, Man Hoi Wong, James S. Speck, and Umesh K. Mishra. "Enhancement-Mode N-Polar GaN MOS-HFET With 5-nm GaN Channel, 510-mS/mm gm and 0.66 Omega-mm R on" IEEE Electron Device Lett. IEEE Electron Device Letters 33.1 (2012): 26-28.*

Yu, Xinxin, Jinyu Ni, Zhonghui Li, Jianjun Zhou, and Cen Kong. "Reduction in Leakage Current in AlGaN/GaN HEMT with Three Al-containing Step-graded AlGaN Buffer Layers on Silicon." Japanese Journal of Applied Physics Jpn. J. Appl. Phys. 53.5 (2014): 051001.*

Miyoshi M, Egawa T, Ishikawa H. Structural characterization of strained AlGaN layers in different Al content AlGaN/GaN heterostructures and its effect on two-dimensional electron transport properties. J Vac Sci Tech B, 2005, 23: 1527-1531.*

XP011441419: The Study of Self-Heating and Hot-Electron Effects for AlGaN/GaN Double Channel HEMTS Xiao-Dong Wang, et al. IEEE Transactions on Electron Devices, vol. 59, No. 5, May 2012.

XP011343984: RF Performance of Deep-Recessed N-Polar GaN MIS-HEMTs Using a Selective Etch Technology Without Ex Situ Surface Passivation, IEEE Electron Device Letters, vol. 32, No. 2. Feb. 2011.

* cited by examiner (A)

(B)

(A)

(B)

NITRIDE SEMICONDUCTOR DEVICE AND FABRICATING METHOD THEREOF

CROSS-REFERENCE TO RELATED APPLICATION

Pursuant to 35 U.S.C. §119(a), this application claims the benefit of earlier filing date and right of priority to Korean Application No. 10-2014-0005705, filed on Jan. 16, 2014, the contents of which is incorporated by reference for all purposes as if fully set forth herein.

BACKGROUND OF THE DISCLOSURE

1. Field of the Disclosure

This specification relates to a nitride semiconductor device and a fabricating method thereof.

2. Background of the Disclosure

An importance of power semiconductor is rising in response to an emphasis of green energy. Power semiconductors which are employed in inverters of electric vehicles, air conditioners, refrigerators and the like are fabricated using silicon. However, a new type of nitride semiconductor attracts attentions in view of a high threshold electric field, low on-resistance, and high temperature and high frequency operation characteristic, as compared with silicon. Thus, there are precedent researches for the new type of nitride semiconductor as a material of a next-generation power semiconductor device.

In recent time, mainstream high power devices include MOSFET and IGBT, and also devices such as GaN-based HEMT, HFET, MOSFET and the like are under studies.

The HEMT which uses high electron mobility is employed for communication devices exhibiting high frequency performance.

Also, the HEMT is used in power semiconductors, communication devices showing high frequency performance, and the like. In recent time, developments of hybrid/fuel cell cars are ongoing, and various overseas corporations are releasing hybrid vehicles. Reliable operations at high temperature are required for semiconductor switches, which are disposed within voltage booster converter and inverter for connecting a motor to a generator within a hybrid vehicle, due to heat generated from an engine. Gallium nitride (GaN) may allow for the reliable operations at the high temperature owing to its wide bandgap, so as to be proper as the next generation semiconductor switch within hybrid cars.

Among others, Furukawa Electrics in Japan has issued an AlGaN/GaN high-electron-mobility transistor (HEMT) discrete, which has a high breakdown voltage of 750V and a low on-resistance of 6.3 mΩ-cm². The company has thusly proved that the HEMT has superior characteristics to the conventional Si MOSFET, Si superjunction MOSFET and SiC MOSFET. Also, the issued GaN discrete has shown a stable switching operation at a high temperature of 225° C.

FIG. 1 is an exemplary view showing a general structure of Heterojunction Field Effect Transistor (HFET).

As shown in FIG. 1, a general HFET 10 may switch a 2 DEG current, which flows from a drain electrode to a source electrode, through a schottky gate electrode.

The general HFET 10 may include a substrate (not illustrated), a first GaN layer 11 formed on the substrate, an AlGaN layer 12 on the first GaN layer 11, a second GaN layer 13 on the AlGaN layer 12, and a gate electrode 14, a source electrode 15 and a drain electrode 16 all formed on the second GaN layer 13.

However, when the high-power semiconductor device is implemented on a small chip, a problem relating to a leakage current level is getting more important to handle.

That is, upon fabricating the AlGaN/GaN HEMT, a leakage current increases due to defective GaN, which accordingly makes it difficult to produce a high-power nitride semiconductor device.

To improve a leakage current characteristic, a growth condition of a GaN buffer layer is used. The use of the growth condition of the GaN buffer layer brings about a reduction of the leakage current, but the reduction of the leakage current may cause a direct affection on strain and quality of an epitaxial (Epi) layer.

SUMMARY OF THE DISCLOSURE

Therefore, an aspect of the detailed description is to provide a nitride semiconductor power device, which has an AlGaN multilayer with Al composition changeable according to a depositing direction and an $Si_xN_y$ layer, so as to minimize an increase in a leakage current and a decrease in a breakdown voltage, caused when fabricating a heterojunction Field Effect Transistor (HFET) device, and a fabricating method thereof.

To achieve these and other advantages and in accordance with the purpose of this specification, as embodied and broadly described herein, there is provided a semiconductor device including a buffer layer, an AlGaN multilayer formed on the buffer layer, a GaN channel layer formed on the AlGaN multilayer, and an AlGaN barrier layer formed on the AlGaN multilayer, wherein aluminum (Al) composition of the AlGaN multilayer may change along a depositing direction of the AlGaN multilayer.

In accordance with one exemplary embodiment, the AlGaN multilayer may include a plurality of AlGaN layers with different Al compositions, respectively.

In accordance with one exemplary embodiment, the plurality of AlGaN layers may be 1 to 30 in number.

In accordance with one exemplary embodiment, the Al composition of the AlGaN multilayer may be in the range of 1% to 70%.

In accordance with one exemplary embodiment, the Al composition of the AlGaN multilayer may increase along the depositing direction of the AlGaN multilayer.

In accordance with one exemplary embodiment, the Al composition of the AlGaN multilayer may decrease along the depositing direction of the AlGaN multilayer.

In accordance with one exemplary embodiment, the Al composition of the AlGaN multilayer may increase along the depositing direction of the AlGaN multilayer, and then decrease, starting from a specific Al composition, along the depositing direction of the AlGaN multilayer.

In accordance with one exemplary embodiment, a thickness of the AlGaN multilayer may be in the range of 1 nm to 300 nm.

In accordance with one exemplary embodiment, the semiconductor device may further include an $Si_xN_y$ layer ($0 \leq x$, $y \leq 1$) formed on the AlGaN barrier layer.

In accordance with one exemplary embodiment, x which is a silicon (Si) composition of the $Si_xN_y$ layer may be in the range of 0.01 to 0.8.

In accordance with one exemplary embodiment, a thickness of the $Si_xN_y$ layer may be in the range of 1 nm to 100 nm.

In accordance with one exemplary embodiment, the $Si_xN_y$ layer may be formed based on $SiH_4$ and $NH_3$.

In accordance with one exemplary embodiment, the $Si_xNy$ layer may be grown on the AlGaN barrier layer in an in-situ manner.

In accordance with one exemplary embodiment, a thickness of the buffer layer may be in the range of 2 um to 7 um.

In accordance with one exemplary embodiment, the buffer layer may be formed of GaN.

In accordance with one exemplary embodiment, a thickness of the GaN channel layer may be in the range of 50 nm to 300 nm.

In accordance with one exemplary embodiment, the GaN channel layer may be doped with at least one of Mg dopant, C dopant and Fe dopant.

In accordance with one exemplary embodiment, a concentration of the at least one dopant may be in the range of $3e^{17}/cm^3$ to $1e^{20}/cm^3$.

In accordance with one exemplary embodiment, a thickness of the AlGaN barrier layer may be in the range of 5 nm to 50 nm.

In accordance with one exemplary embodiment, the Al composition of the AlGaN barrier layer may be in the range of 10% to 30%.

In accordance with one exemplary embodiment, the buffer layer may be formed on a substrate.

In accordance with one exemplary embodiment, the substrate may be formed of at least one of Si, SiC, sapphire and GaN.

In accordance with one exemplary embodiment, the semiconductor device may further include a source electrode, a drain electrode and a gate electrode all formed on a partial region of the AlGaN barrier layer.

To achieve these and other advantages and in accordance with the purpose of this specification, as embodied and broadly described herein, there is provided a method for fabricating a semiconductor device including forming a buffer layer on a substrate, forming an AlGaN multilayer on the buffer layer, forming a GaN channel layer on the AlGaN multilayer, and forming an AlGaN barrier layer on the GaN channel layer, wherein an aluminum (Al) composition of the AlGaN multilayer may increase along a depositing direction of the AlGaN multilayer.

In accordance with one exemplary embodiment, the AlGaN multilayer may include a plurality of AlGaN layers with different Al compositions, respectively.

In accordance with one exemplary embodiment, the plurality of AlGaN layers may be 1 to 30 in number.

In accordance with one exemplary embodiment, the Al composition of the AlGaN multilayer may be in the range of 1% to 70%.

In accordance with one exemplary embodiment, a thickness of the AlGaN multilayer may be in the range of 1 nm to 300 nm.

In accordance with one exemplary embodiment, the method may further include forming an $Si_xNy$ layer ($0 \le x$, $y \le 1$) on the AlGaN barrier layer.

In accordance with one exemplary embodiment, x which is a silicon (Si) composition of the $Si_xNy$ layer may be in the range of 0.01 to 0.8.

In accordance with one exemplary embodiment, a thickness of the $Si_xNy$ layer may be in the range of 1 nm to 100 nm.

In accordance with one exemplary embodiment, the $Si_xNy$ layer may be formed based on $SiH_4$ and $NH_3$.

In accordance with one exemplary embodiment, the $Si_xNy$ layer may be grown on the AlGaN barrier layer in an in-situ manner.

In accordance with one exemplary embodiment, at least one of the buffer layer, the AlGaN multilayer, the GaN channel layer and the AlGaN barrier layer may be formed based on at least one of metal organic chemical vapor deposition (MOCVD), molecular beam epitaxy (MBE), hydride vapor phase epitaxy (HVPE), plasma-enhanced chemical vapor deposition (PECVD), sputtering, and atomic layer deposition (ALD).

In accordance with one exemplary embodiment, this specification provides a nitride semiconductor power device having an AlGaN multilayer, which has changeable Al composition along a depositing direction, and $Si_xNy$ layer, so as to minimize an increase in a leakage current and a decrease in a breakdown voltage, which are caused while fabricating a heterojunction type HFET device, and a fabricating method thereof.

According to the semiconductor device disclosed herein, the formation of the AlGaN multilayer and the $Si_xNy$ layer may allow for a reduction of vertical leakage current paths and surface leakage current paths and for an increase in a breakdown voltage of the semiconductor device, resulting in an implementation of a high-power high-efficiency semiconductor device.

Also, a reduction of a 2 DEG due to the additional layer (for example, the AlGaN multilayer) may be prevented by the $Si_xNy$ layer, which may result in an acquisition of a desired leakage current reduction result without a decrease in the 2 DEG characteristic.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Figure 1:
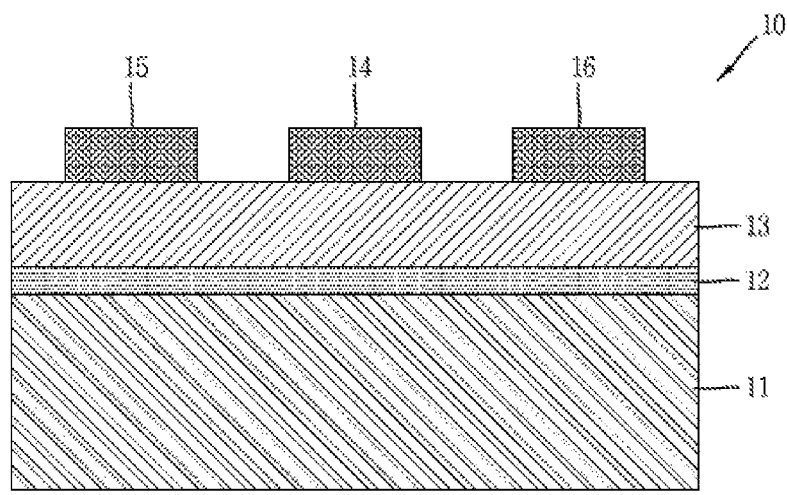
FIG. 1 is an exemplary view of a general structure of an HFET.

The technology disclosed herein may be applied to a Heterojunction Field Effect Transistor (HFET) and a fabricating method thereof. The technology disclosed herein is not limited to this, and may also be applicable to all kinds of application fields of nitride semiconductor devices and fabricating methods thereof to which the technological spirit of the technology can be applied.

Recently, a light-emitting diode (LED) including red wavelength bands in ultraviolet rays and a reddish-blue laser diode have been completely developed according to a growth technique of a nitride semiconductor, and are being widely used for traffic lights, electric signs, mobile phones and the like.

A power device using the nitride semiconductor has fast switching speed, an excellent withstanding voltage and fast current saturation speed, as compared with an Si-based device, and thus has many advantages for high-output high-voltage rather than the Si-based semiconductor devices.

That is, GaN which is a representative of nitride semiconductors supplies great bandgap energy and is able to form a two-dimensional (2D) 2 DEG channel through heterojunction. Therefore, the GaN semiconductor has a great threshold voltage and enables a high-speed operation.

Such high-power and high-speed characteristic is very suitable for power semiconductors which require for a high operation voltage and a less switching energy loss. Thus, the GaN is attracting attention as a material for a next-generation power semiconductor.

To create the nitride-based HFET, an epitaxial layer having a 2 DEG structure has to be grown. Here, substrates made of sapphire, Si, SiC, AlN and the like are used.

Here, the Si substrate has many advantages as a substrate of the nitride power semiconductor owing to being allowed for mass production and low price. However, Si has a low thermal expansion coefficient than GaN. Accordingly, when it is cooled down after the growth, the GaN layer is affected by tensile stress, which may increase probability that cracks are generated on the layer.

That is, since a compound semiconductor is generally used on dissimilar substrates, stress and defect may be caused due to a lattice constant mismatch. Also, a growth of an epitaxial layer of high quality is made difficult due to a crystalline defect and the like caused due to imperfect bonding of the compound and various paths of a leakage current are present.

In detail, among power semiconductors, GaN as the nitride semiconductor is focused on as a device having a high breakdown voltage and low on-resistance.

However, the substrate requires for a high unit cost and difficulty in fabrication to grow a non-defective GaN while maintaining a lattice mismatch. This may bring about difficulty in the device growth.

The conventional semiconductor process is unable to be executed to treat sapphire or SiC after grown. Accordingly, a new process has to be developed. This is the reason of using a silicon substrate of which unit cost is low and for which a semiconductor process has already been established. When the silicon is grown directly on GaN as the nitride semiconductor, the epitaxial layer may be defectively grown due to the lattice mismatch between the silicon and the GaN. When a device is fabricated using the silicon, defects may serve as leakage paths so as to increase a leakage current of the device.

As a method for solving the problems, a carbon or Mg dopant is highly doped on a GaN buffer layer to generate a deep acceptor level so as to reduce the leakage current. Or, epitaxial quality of the very GaN buffer layer may be improved to reduce defect density so as to block the leakage paths.

Or, a device fabricating method in which an epitaxial characteristic is improved by using a thick GaN buffer layer may also be employed.

Here, those methods are executed by changing growth conditions of the GaN buffer layer. This may cause a strain of an entire device, and affect related bow and epi quality.

However, a reduction of a leakage current in a manner of a layer insertion can reduce a specific leakage current path. It has an advantage in view of reducing the greatest two leakage paths, namely, vertical and surface leakage paths, without a great change in the epi quality.

The technology disclosed herein relates to a method of fabricating a nitride semiconductor HFET device, and a method for fabricating a high power device, and a structure thereof.

In detail, the technology disclosed herein can improve a breakdown voltage characteristic of a device, in a manner of raising a conduction band level by inserting 1 to 70% of AlGaN layer (or AlGaN multilayer) in the middle of a GaN bulk such that electrons cannot be easily penetrated toward the GaN bulk, and then reducing a vertical leakage current, as one of leakage paths of an HEMT epi structure.

Also, a surface path which is a main leakage current path in the HFET epi structure can be reduced by growing an $Si_xNy$ layer on the AlGaN layer (or AlGaN multilayer) in an in-situ manner.

The AlGaN multilayer serves a function of blocking a leakage current so as to be referred to as an AlGaN back barrier layer.

The nitride semiconductor device having the AlGaN multilayer and the in-situ $Si_xNy$ layer may have reduced surface leakage current and vertical leakage current, which may result in a reduction of an entire leakage current level. Also, a 2 DEG which may be reduced by the AlGaN back barrier may be compensated for by $Si_xNy$.

That is, the technology disclosed herein desires to lower the leakage current level by further providing two layers, namely, the $Si_xNy$ layer and the AlGaN multilayer (or the AlGaN back barrier), to the conventional AlGaN/GaN HEMT structure.

Also, the 2 DEG, which may be reduced due to the AlGaN multilayer, can be compensated for by the $Si_xNy$ layer. This may result in a reduction of only the leakage current characteristic of the device.

It should be noted that technological terms used herein are merely used to describe a specific embodiment, but not to limit the present invention. Also, unless particularly defined otherwise, technological terms used herein should be construed as a meaning that is generally understood by those having ordinary skill in the art to which the invention pertains, and should not be construed too broadly or too narrowly. Furthermore, if technological terms used herein are wrong terms unable to correctly express the spirit of the invention, then they should be replaced by technological terms that are properly understood by those skilled in the art. In addition, general terms used in this invention should be construed based on the definition of dictionary, or the context, and should not be construed too broadly or too narrowly.

Incidentally, unless clearly used otherwise, expressions in the singular number include a plural meaning. In this application, the terms "comprising" and "including" should not be construed to necessarily include all of the elements or steps disclosed herein, and should be construed not to include some of the elements or steps thereof, or should be construed to further include additional elements or steps.

Furthermore, the terms including an ordinal number such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of right of the invention.

Hereinafter, preferred embodiments of the present invention will be described in detail with reference to the accompanying drawings, and the same or similar elements are designated with the same numeral references regardless of the numerals in the drawings and their redundant description will be omitted.

In describing the present invention, moreover, the detailed description will be omitted when a specific description for publicly known technologies to which the invention pertains is judged to obscure the gist of the present invention. Also, it should be noted that the accompanying drawings are merely illustrated to easily explain the spirit of the invention, and therefore, they should not be construed to limit the spirit of the invention by the accompanying drawings.

Hereinafter, description will be given of a structure of a semiconductor device and a fabricating method thereof according to one exemplary embodiment disclosed herein, with reference to FIGS. 2 to 5.

Description of Semiconductor Device According to One Exemplary Embodiment

A semiconductor device according to one exemplary embodiment disclosed herein may include a buffer layer, an AlGaN multilayer on the buffer layer, a GaN channel layer on the AlGaN multilayer, and an AlGaN barrier layer on the GaN channel layer.

Here, an aluminum (Al) composition of the AlGaN multilayer may change according to a depositing direction of the AlGaN multilayer.

In accordance with one exemplary embodiment, the AlGaN multilayer may include a plurality of AlGaN layers having different Al compositions, respectively.

In accordance with one exemplary embodiment, the plurality of AlGaN layers may be 1 to 30 in number.

In accordance with one exemplary embodiment, the Al composition of the AlGaN multilayer may be in the range of 1% to 70%.

In accordance with one exemplary embodiment, the Al composition of the AlGaN multilayer may increase along the depositing direction of the AlGaN multilayer.

In accordance with one exemplary embodiment, the Al composition of the AlGaN multilayer may decrease along the depositing direction of the AlGaN multilayer.

In accordance with one exemplary embodiment, the Al composition of the AlGaN multilayer may increase along the depositing direction of the AlGaN multilayer, and then decrease, starting from a specific Al composition, along the depositing direction of the AlGaN multilayer.

In accordance with one exemplary embodiment, the AlGaN multilayer may be 1 nm to 300 nm thick.

In accordance with one exemplary embodiment, the semiconductor device may further include an $Si_xNy$ ($0 \leq x, y \leq 1$) on the AlGaN barrier layer.

In accordance with one exemplary embodiment, x which is a silicon (Si) composition of the $Si_xNy$ layer may be in the range of 0.01 to 0.8.

In accordance with one exemplary embodiment, the $Si_xNy$ layer may be 1 nm to 100 nm thick.

In accordance with one exemplary embodiment, the $Si_xNy$ layer may be formed based on $SiH_4$ and $NH_3$.

In accordance with one exemplary embodiment, the $Si_xNy$ layer may be grown on the AlGaN barrier layer in an in-situ manner.

In accordance with one exemplary embodiment, the buffer layer may be 2 um to 7 um thick.

In accordance with one exemplary embodiment, the buffer layer may be formed of gallium nitride (GaN).

In accordance with one exemplary embodiment, the GaN channel layer may be 50 nm to 300 nm thick.

In accordance with one exemplary embodiment, the GaN channel layer may be doped with at least one of Mg dopant, C dopant and Fe dopant.

In accordance with one exemplary embodiment, a concentration of the at least one dopant may be in the range of $3e^{17}/cm^3$ to $1e^{20}/cm^3$.

In accordance with one exemplary embodiment, the AlGaN barrier layer may be 5 nm to 50 nm thick.

In accordance with one exemplary embodiment, the Al composition of the AlGaN barrier layer may be in the range of 10% to 30%.

In accordance with one exemplary embodiment, the buffer layer may be formed on a substrate.

In accordance with one exemplary embodiment, the substrate may be formed of at least one of Si, SiC, sapphire, and GaN.

In accordance with one exemplary embodiment, the semiconductor device may further include a source electrode, a drain electrode and a gate electrode which are formed on a partial region of the AlGaN barrier layer.

Figure 2:
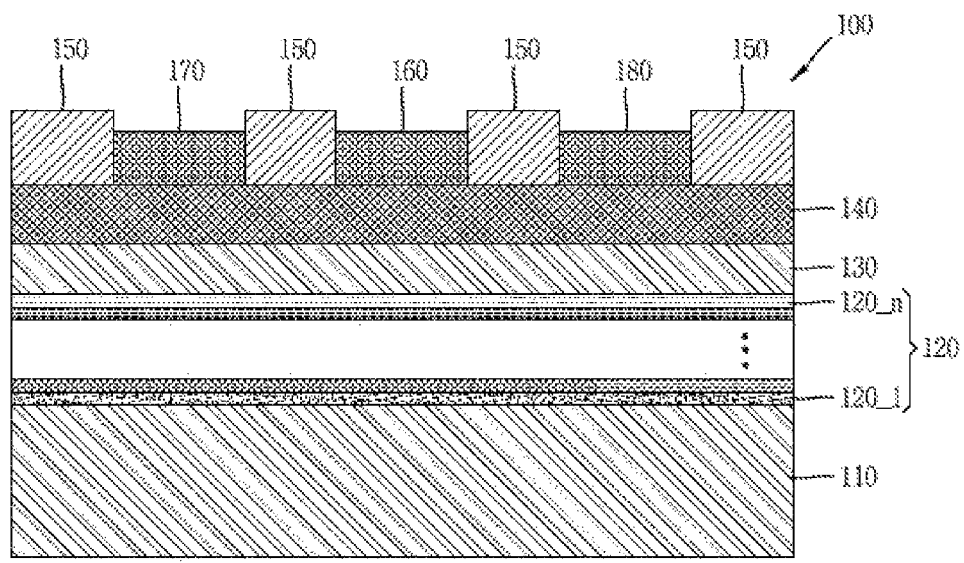
FIG. 2 is an exemplary view illustrating a structure of a semiconductor device in accordance with one exemplary embodiment disclosed herein.

FIG. 2 is an exemplary view illustrating a structure of a semiconductor device in accordance with one exemplary embodiment disclosed herein.

As illustrated in FIG. 2, a semiconductor device 100 in accordance with one exemplary embodiment disclosed herein may include a buffer layer 110, an AlGaN multilayer 120, a GaN channel layer 130, and an AlGaN barrier layer 140.

The semiconductor device 100 may further include an $Si_xNy$ layer 150 formed on the AlGaN barrier layer 140.

The semiconductor device 100 may further include a source electrode 170, a drain electrode 180, and a gate electrode 160 formed on a partial region of the AlGaN barrier layer 140.

In detail, referring to FIG. 2, the $Si_xNy$ layer 150 may be formed on a partial region of the AlGaN barrier layer 140, and the source electrode 170, the drain electrode 180 and the gate electrode 160 may be formed on the other region of the AlGaN barrier layer 140.

The semiconductor device 100 may switch a 2 DEG current, which flows from the drain electrode 180 to the source electrode 170, through the schottky gate electrode 160.

Here, the buffer layer 110 may be formed on a substrate (not illustrated).

In accordance with one exemplary embodiment, the substrate may be an n-type substrate or a p-type substrate, and may be formed of various types of materials. For example, the substrate may be at least one of an insulating substrate, a sapphire substrate, a GaN substrate, an SiC substrate, an AlN substrate and an Si substrate. In addition to those, it may be obvious to those skilled in the art that various types of substrates can be applied to the semiconductor device disclosed herein Also, the substrate may be removed after fabrication of the semiconductor device 100. Therefore, the ultimate structure of the semiconductor device 100 may be a structure without the substrate.

The buffer layer 110 may be a buffer layer made of GaN (or a GaN buffer layer).

The buffer layer 110 may be 2 um to 7 um thick.

The buffer layer 110 may be formed in various manners. For example, the buffer layer 110 may be formed in a manner of selectively growing a nitride semiconductor crystal, especially, based on at least one of metal organic chemical vapor deposition (MOCVD), molecular beam epitaxy (MBE) and hydride vapor phase epitaxy (HVPE). Here, taking into account crystallinity of the buffer layer 110, the MOCVD method may be generally employed in device fabrication.

The AlGaN multilayer 120 may include a plurality of AlGaN layers having different compositions of Al, respectively.

FIG. 2 illustrates a case where the AlGaN multilayer 120 includes n-numbered AlGaN layers 120_1 to 120_n each having a different Al composition.

In accordance with one exemplary embodiment, the plurality of AlGaN layers may be 1 to 30 in number (namely, n=30).

In accordance with one exemplary embodiment, the AlGaN multilayer 120 may be 1 nm to 300 nm thick.

The Al composition of the AlGaN multilayer 120 may be in the range of 1% to 70% (or in the range of 0.01 to 0.7).

The AlGaN multilayer 120 may be formed in various manners. For example, the AlGaN multilayer 120 may be formed in a manner of selectively growing a nitride semiconductor crystal, especially, based on at least one of metal organic chemical vapor deposition (MOCVD), molecular beam epitaxy (MBE) and hydride vapor phase epitaxy (HVPE). Here, taking into account crystallinity of the AlGaN multilayer 120, the MOCVD method may be generally employed in device fabrication.

In accordance with one exemplary embodiment, the Al composition of the AlGaN multilayer 120 may be changeable according to a depositing direction of the AlGaN multilayer 120.

Here, the change in the Al composition according to the depositing direction of the AlGaN multilayer 120 may be various.

For example, the Al composition of the AlGaN multilayer 120 may increase according to the depositing direction of the AlGaN multilayer 120.

As another example, the Al composition of the AlGaN multilayer 120 may decrease according to the depositing direction of the AlGaN multilayer 120.

Also, the Al composition of the AlGaN multilayer 120 may increase according to the depositing direction of the AlGaN multilayer 120, and then decrease, starting from a specific Al composition (for example, when the Al composition is 70%), according to the depositing direction of the AlGaN multilayer 120.

Besides, it may be obvious to a skilled person in the art that the various Al composition changes according to the depositing direction of the AlGaN multilayer 120 can be applied to a semiconductor device according to one exemplary embodiment disclosed herein.

Figure 3:
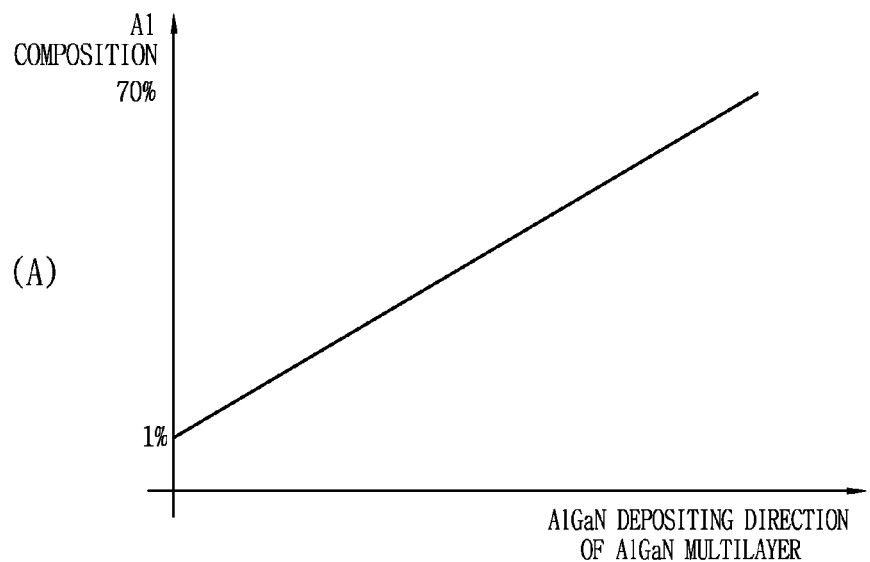
FIGS. 3 to 5 are exemplary views illustrating changes in Al composition in accordance with one exemplary embodiment disclosed herein.
Figure 3:
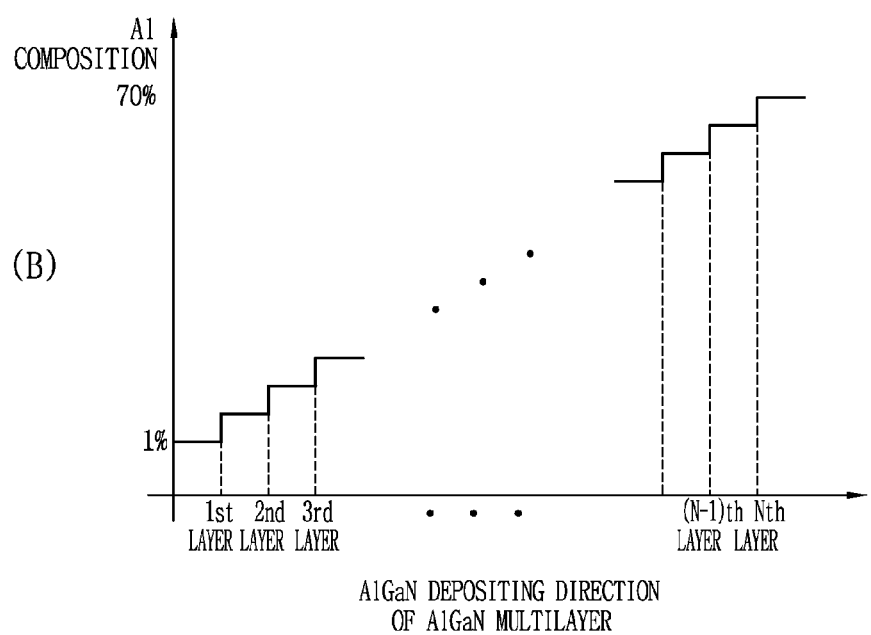
Figure 4:
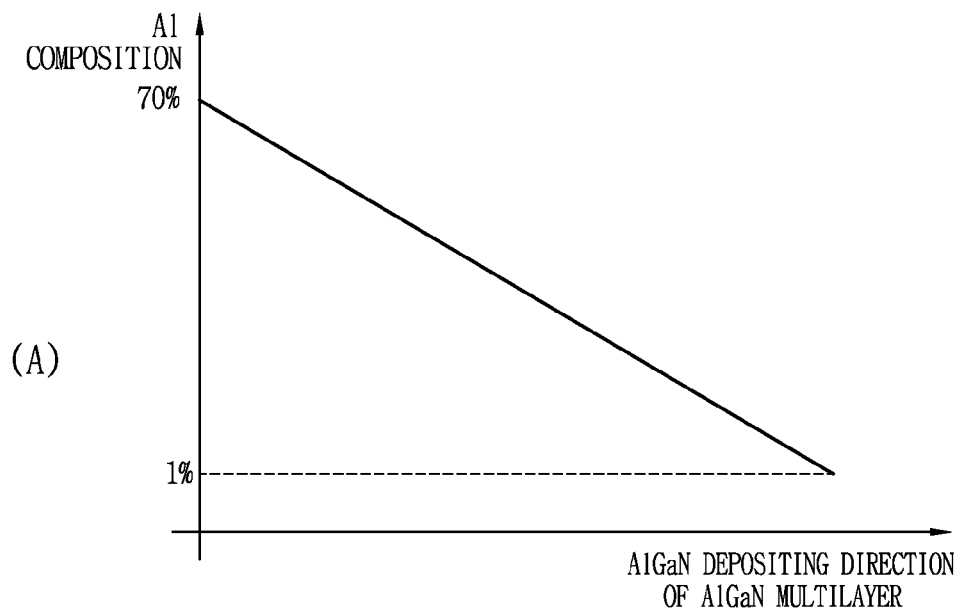
Figure 4:
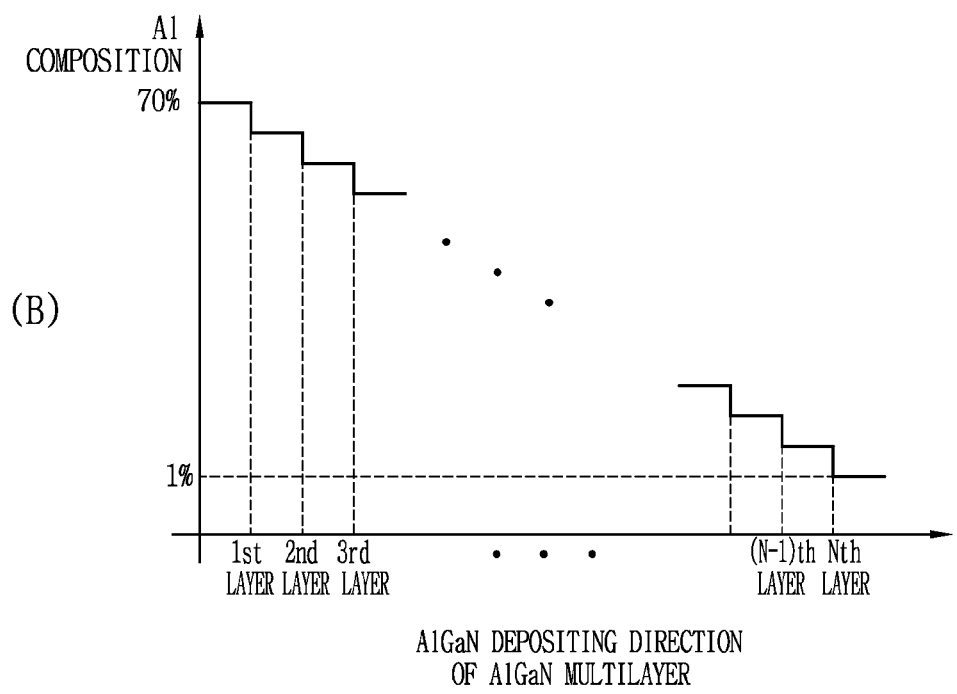
Figure 5:
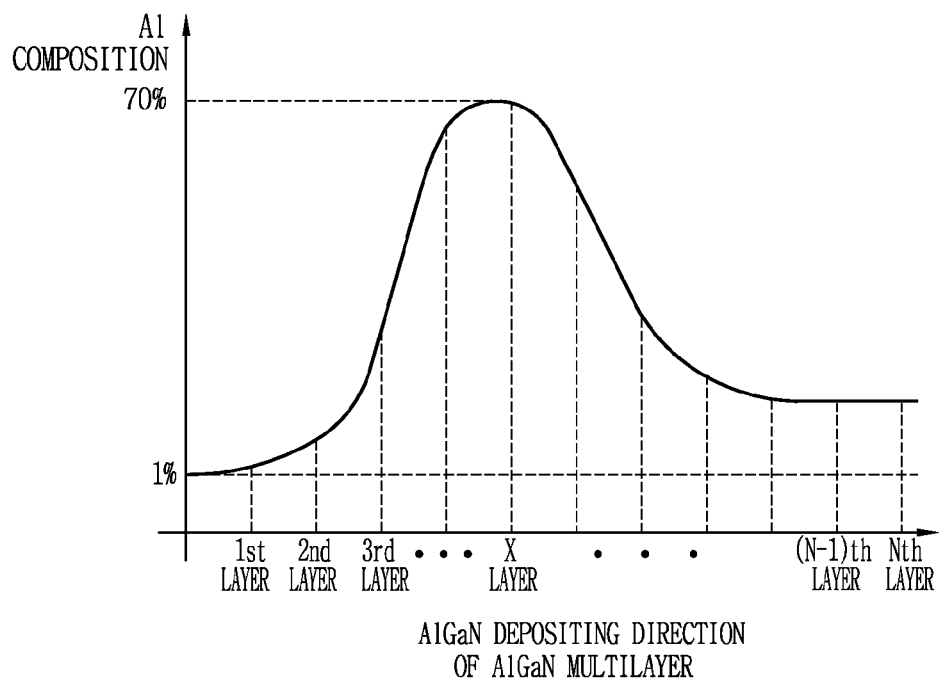

FIGS. 3 to 5 are exemplary views illustrating changes in Al compositions in accordance with one exemplary embodiment disclosed herein.

As illustrated in FIG. 3, an Al composition of the AlGaN multilayer 120 may increase according to the depositing direction of the AlGaN multilayer 120.

For example, the Al composition of the AlGaN multilayer 120 may increase according to the depositing direction of the AlGaN multilayer 120 in a continuous or graded manner (see (a) of FIG. 3).

In this case, the Al composition may also continuously change (increase) within n-numbered AlGaN layers (first to nth layers) which are included in the AlGaN multilayer 120 and have different Al compositions, respectively.

In another example, the Al composition of the AlGaN multilayer 120 may increase according to the depositing direction of the AlGaN multilayer in a non-continuous or stepwise manner (see (b) of FIG. 3).

In this case, each Al composition of the AlGaN layers (first to nth layers), which are included in the AlGaN multilayer 120 and have different Al compositions, respectively, may be maintained (see (b) of FIG. 3).

Referring to FIG. 4, the Al composition of the AlGaN multilayer 120 may decrease according to the depositing direction of the AlGaN multilayer 120.

For example, the Al composition of the AlGaN multilayer 120 may decrease according to the depositing direction of the AlGaN multilayer 120 in a continuous or graded manner (see (a) of FIG. 4).

In this case, the Al composition may also continuously change (decrease) within n-numbered AlGaN layers (first to nth layers) which are included in the AlGaN multilayer 120 and have different Al compositions, respectively.

In another example, the Al composition of the AlGaN multilayer 120 may decrease according to the depositing direction of the AlGaN multilayer in a non-continuous or stepwise manner (see (b) of FIG. 4).

In this case, each Al composition of the AlGaN layers (first to nth layers), which are included in the AlGaN multilayer 120 and have different Al compositions, respectively, may be maintained (see (b) of FIG. 4).

As illustrated in FIG. 5, the Al composition of the AlGaN multilayer 120 may increase according to the depositing direction of the AlGaN multilayer 120, and then decrease, starting from a specific Al composition, according to the depositing direction of the AlGaN multilayer 120.

For example, the specific Al composition may be 70% (see FIG. 5).

In detail, still referring to FIG. 5, the Al composition of the AlGaN multilayer 120 may variously change within a specific composition range according to the depositing direction of the AlGaN multilayer 120.

For example, as illustrated in FIG. 5, the Al composition of the AlGaN multilayer 120 may increase from a lower AlGaN layer (for example, a first layer) toward an upper AlGaN layer, and then decrease after a specific Al composition (for example, 70%).

In accordance with one exemplary embodiment, the Al composition of the AlGaN multilayer 120 may increase from a lower AlGaN layer (for example, a first layer) toward an upper AlGaN layer, and then decrease after a specific AlGaN layer (for example, an Xth layer illustrated in FIG. 5).

In detail, still referring to FIG. 5, the Al composition of the AlGaN multilayer 120 may increase up to a specific position within the AlGaN multilayer 120 along the depositing direction of the AlGaN multilayer 120, and then decrease after the position.

Referring back to FIG. 2, the GaN channel layer 130 may be formed on the AlGaN multilayer 120.

A thickness of the GaN channel layer 130 may be in the range of 50 nm to 1000 nm, specifically, in the range of 50 nm to 300 nm.

The GaN channel layer 130 may be formed in various manners. For example, the GaN channel layer 130 may be formed in a manner of a nitride semiconductor crystal, especially, based on at least one of metal organic chemical vapor deposition (MOCVD), molecular beam epitaxy (MBE) and hydride vapor phase epitaxy (HVPE). Here, taking into account crystallinity of the GaN channel layer 130, the MOCVD method may be generally employed in device fabrication.

In accordance with one exemplary embodiment, the GaN channel layer 130 may be doped with at least one of C, Fe, Mg and Mn dopants. In other words, the semiconductor device 100 may further include a high-resistance GaN layer (not illustrated) formed on the GaN channel layer 130 for representing a semi-insulating characteristic of a GaN channel, which is formed by injecting at least one of the C, Fe, Mg and Mn dopants.

Here, a concentration of the at least one dopant may be $1e^{16}/cm^3$ to $5e^{20}/cm^3$. Specifically, the concentration of the at least one dopant may be $3e^{17}/cm^3$ to $1e^{20}/cm^3$.

In particular, when the at least one dopant is the C dopant, doping more than $1e^{18}/cm^3$ may generally be carried out.

As aforementioned, in order to form a channel layer along which a current flows, impurity doping on an end portion of the GaN channel layer 130 should be minimized, and specifically, the concentration of C doped should be less than $1e^{17}/cm^3$.

In accordance with one exemplary embodiment, the GaN channel layer 130 may include a plurality of layers formed of GaN grown at different temperatures.

In accordance with one exemplary embodiment, the plurality of GaN layers grown at different temperatures may be 2 to 5 in number.

The AlGaN barrier layer 140 may be formed on the GaN channel layer 130, so as to form a 2 DEG on the channel layer.

That is, the AlGaN barrier layer 140 may be formed on the GaN channel layer 130, and the AlGaN barrier layer 140 may serve as an active layer.

A thickness of the AlGaN barrier layer 140 may be 2 nm to 100 nm thick. Specifically (or preferentially), the thickness of the AlGaN barrier wall may be in the range of 5 nm to 50 nm.

The AlGaN barrier layer 140 may be formed with various compositions. For example, the Al composition of the AlGaN barrier layer 140 may be in the range of 10% to 30%. In addition to this, it may be obvious to a skilled person in the art that the AlGaN barrier layer 140 may be formed by various composition ratios.

Specifically, the Al composition of the AlGaN barrier layer 140 may be 25%, and the thickness thereof may be 25 nm.

The AlGaN barrier layer 140 may be formed in various manners. For example, the AlGaN barrier layer 140 may be formed in a manner of a nitride semiconductor crystal, especially, based on at least one of metal organic chemical vapor deposition (MOCVD), molecular beam epitaxy (MBE) and hydride vapor phase epitaxy (HVPE). Here, taking into account crystallinity of the AlGaN barrier layer 140, the MOCVD method may be generally employed in device fabrication.

The $Si_xNy$ 150 ($0 \leq x, y \leq 1$) may be formed on the AlGaN barrier layer 140.

In detail, referring back to FIG. 2, the $Si_xNy$ layer 150 may be formed on a partial region of the AlGaN barrier layer 140, and the source electrode 170, the drain electrode 180 and the gate electrode 160 may be formed on the other region of the AlGaN barrier wall 140.

In accordance with one exemplary embodiment, x which is a silicon (Si) composition of the $Si_xNy$ layer 150 may be in the range of 0.01 to 0.8. That is, the Si composition of the $Si_xNy$ layer 150 may be in the range of 1% to 80%.

A thickness of the $Si_xNy$ layer 150 may be in the range of 1 nm to 100 nm.

In accordance with one exemplary embodiment, the $Si_xNy$ layer 150 may be formed based on $SiH_4$ which is a source of Si and $NH_3$ which is a source of N.

In accordance with one exemplary embodiment, the $Si_xNy$ layer 150 may be grown on the AlGaN barrier layer 140 in an in-situ manner.

For example, the AlGaN barrier layer 140 may be formed by deposition equipment based on MOCVD, and the $Si_xNy$ layer 150 may be formed by an in-situ method by which the layer is grown directly within the deposition equipment after the formation of the AlGaN barrier layer 140.

Also, the $Si_xNy$ layer 150 may be formed in various manners. For example, the $Si_xNy$ layer 150 may be formed based on at least one of metal organic chemical vapor deposition (MOCVD), molecular beam epitaxy (MBE) and hydride vapor phase epitaxy (HVPE), plasma-enhanced chemical vapor deposition (PECVD), sputtering and atomic layer deposition (ALD).

As aforementioned, the source electrode 170, the drain electrode 180 and the gate electrode 160 may be formed on a partial region of the AlGaN barrier layer 140.

A 2 DEG (CDEG) current which flows from the drain electrode 180 and the source electrode 170 may be generated by the control of the schottky gate electrode 160.

Description of Fabrication Method of Semiconductor Device According to One Exemplary Embodiment A method for fabricating a semiconductor device in accordance with one exemplary embodiment disclosed herein may include forming a buffer layer on a substrate, forming an AlGaN multilayer on the buffer layer, forming a GaN channel layer on the AlGaN multilayer, and forming an AlGaN barrier layer on the GaN channel layer.

Here, an aluminum (Al) composition of the AlGaN multilayer may increase along a depositing direction of the AlGaN multilayer.

In accordance with one exemplary embodiment, the AlGaN multilayer may include a plurality of AlGaN layers with different Al compositions, respectively.

In accordance with one exemplary embodiment, the plurality of GaN layers may be 1 to 30 in number.

In accordance with one exemplary embodiment, the Al composition of the AlGaN multilayer may increase from 1% up to 70% along the depositing direction of the AlGaN multilayer.

In accordance with one exemplary embodiment, the thickness of the AlGaN multilayer may be in the range of 1 nm to 300 nm.

In accordance with one exemplary embodiment, the fabricating method may further include forming an $Si_xNy$ layer ($(0 \leq x, y \leq 1)$) on the AlGaN barrier layer.

In accordance with one exemplary embodiment, x which is an Si composition of the $Si_xNy$ layer may be in the range of 0.01 to 0.8.

A thickness of the $Si_xNy$ layer may be in the range of 1 nm to 100 nm.

In accordance with one exemplary embodiment, the $Si_xNy$ layer may be formed based on $SiH_4$ and $NH_3$.

In accordance with one exemplary embodiment, the $Si_xNy$ layer may be grown on the AlGaN barrier layer in an in-situ manner.

Also, in accordance with one exemplary embodiment, at least one of the buffer layer, the AlGaN multilayer, the GaN channel layer and the AlGaN barrier layer may be formed based on at least one of metal organic chemical vapor deposition (MOCVD), molecular beam epitaxy (MBE) and hydride vapor phase epitaxy (HVPE), plasma-enhanced chemical vapor deposition (PECVD), sputtering, and atomic layer deposition (ALD).

Figure 6:
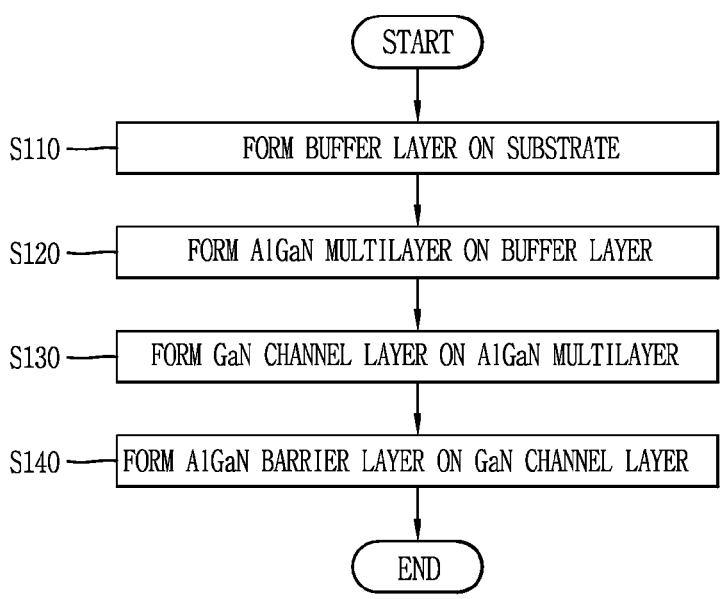
FIG. 6 is a flowchart illustrating a method for fabricating a semiconductor device in accordance with one exemplary embodiment disclosed herein.

FIG. 6 is a flowchart illustrating a method for fabricating a semiconductor device in accordance with one exemplary embodiment disclosed herein.

As illustrated in FIG. 6, a method for fabricating a semiconductor device in accordance with one exemplary embodiment disclosed herein may include the following steps.

First, a buffer layer may be formed on a substrate (5110).

An AlGaN multilayer may be formed on the buffer layer (S 120).

A GaN channel layer may be formed on the AlGaN multilayer (S 130).

An AlGaN barrier layer may then be formed on the GaN channel layer (S 140).

Here, an Al composition of the AlGaN multilayer may increase along a depositing direction of the AlGaN multilayer.

In accordance with one exemplary embodiment, an $Si_xNy$ layer ($0 \le x$, $y \le 1$) may further be formed on the AlGaN barrier layer.

FIGS. 7A to 7E are exemplary views illustrating a method for fabricating a semiconductor device in accordance with one exemplary embodiment disclosed herein.

As illustrated in FIGS. 7A to 7E, a method for fabricating a semiconductor device in accordance with one exemplary embodiment may include steps of forming on a substrate (not illustrated) a buffer layer 110, an AlGaN multilayer 120, a GaN channel layer 130 and an AlGaN barrier layer 140, in a sequential manner.

As aforementioned, the substrate may be removed after fabricating the semiconductor device 100. Therefore, the ultimate structure of the semiconductor device 100 may be a structure without the substrate.

The fabricating method may further include forming an $Si_xNy$ layer (($0 \le x$, $y \le 1$) on the AlGaN barrier layer.

Also, the fabricating method may further include forming a gate electrode 160, a source electrode 170, and a drain electrode 180 on a partial region of the AlGaN barrier layer 140.

Figure 7A:
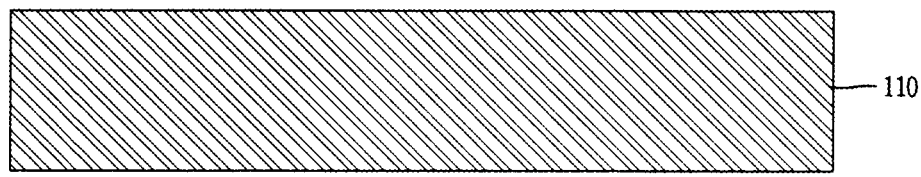
FIGS. 7A to 7E are exemplary views illustrating a method for fabricating a semiconductor device in accordance with one exemplary embodiment disclosed herein.

Hereinafter, detailed processes will be described in a sequential manner with reference to FIGS. 7A to 7E. First, a buffer layer 110 may be formed (or grown) on a substrate (not illustrated) by use of MOCVD thin film growing equipment (FIG. 7A).

For example, when the buffer layer 110 is a GaN buffer layer made of GaN, a nitride gallium thin film may be grown on the substrate. In this case, TMGa may be used as a raw material of GaN, and $NH_3$ may be used as a raw material of N. The two materials may be composited under a high temperature environment so as to be grown into an epitaxial layer. The thickness of the buffer layer (or the GaN buffer layer) may be in the range of 1 um to 15 um, specifically, in the range of 2 um to 7 um.

The substrate may be an n-type substrate or a p-type substrate, and a type of the substrate may be an Si substrate, an SiC substrate, a sapphire substrate, a GaN substrate (for example, freestanding GaN), an AlN substrate, and the like.

Figure 7B:
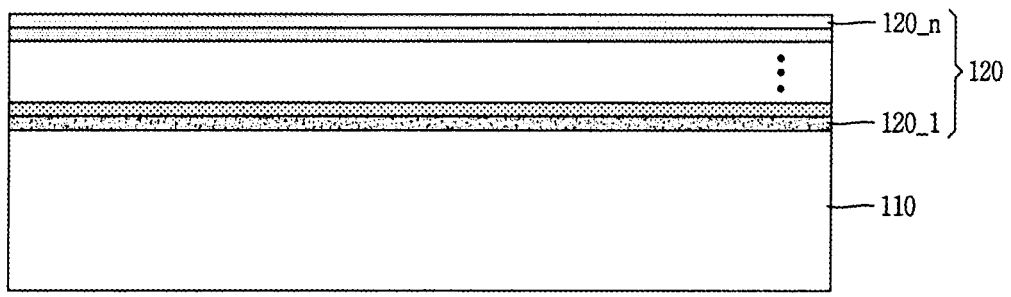

Next, an AlGaN multilayer 120 whose Al composition changes along a depositing direction thereof may be formed on the buffer layer 110 (FIG. 7B).

The AlGaN multilayer 120 may include a plurality of GaN layers with different Al compositions, respectively.

The fabricating method illustrated in FIGS. 7A to 7E may include a case where the AlGaN multilayer 120 includes n-numbered AlGaN layers 120_1 to 120_n.

For example, the plurality of AlGaN layers with the different Al compositions may be 1 to 30 in number (namely, n=1~30).

The AlGaN multilayer 120 may serve to block a vertical leakage current, so it may also be referred to as an AlGaN back barrier layer.

In detail, the technology disclosed in this specification relates to growing the AlGaN multilayer 120 (or the AlGaN back barrier), in which Al composition changes along the depositing direction of the AlGaN multilayer 120 in a grading manner, on the buffer layer (for example, the GaN buffer).

Here, after stopping the GaN growth, an interruption time of about 5 to 20 seconds may be set before the growth of the AlGaN layer 120 (AlGaN back barrier).

In accordance with one exemplary embodiment, the graded steps of the Al composition may include 1 to 30 steps. In other words, the plurality of AlGaN layers with the different Al compositions may be 1 to 30 in number (that is, n=1~30).

The Al composition of each layer may change in the range of 1% to 70%.

Also, the AlGaN multilayer 120 (or the AlGaN back barrier) may be grown into a supper lattice shape.

The thickness of the AlGaN multilayer 120 (or the AlGaN back barrier) may be in the range of 1 nm to 1000 nm, specifically, in the range of 1 nm to 300 nm.

Figure 7C:
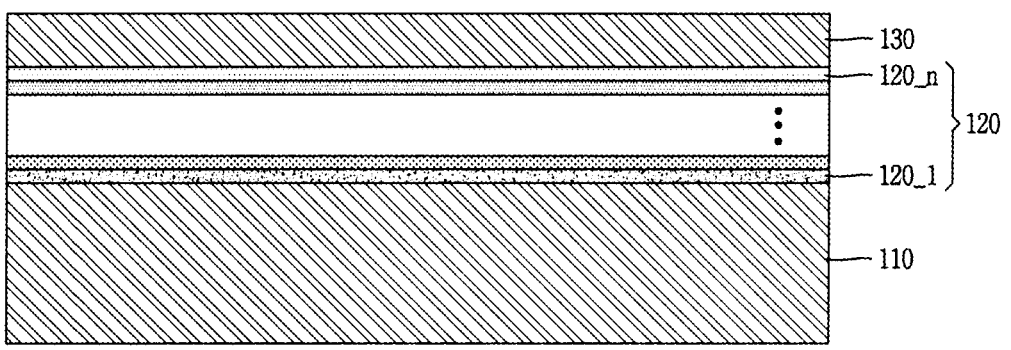

Next, a GaN channel layer 130 may be formed on the AlGaN multilayer 120 (FIG. 7C).

The GaN forming the GaN channel layer 130 may generally be formed by MOCVD.

In this case, TMGa as a raw material of Ga and $NH_3$ as a raw material of N may be composited within a reactor at high temperature, to epitaxially grow the GaN channel layer 130.

The thickness of the GaN channel layer 130 may be in the range of 50 nm to 1000 nm, specifically (or preferentially), in the range of 50 nm to 300 nm.

Here, the GaN channel layer 130 may be doped with Fe, Mg or carbon to create a semi-insulating characteristic. The GaN channel layer 130 may also be grown at one temperature or at two to 5 continuous or non-continuous temperatures.

Figure 7D:
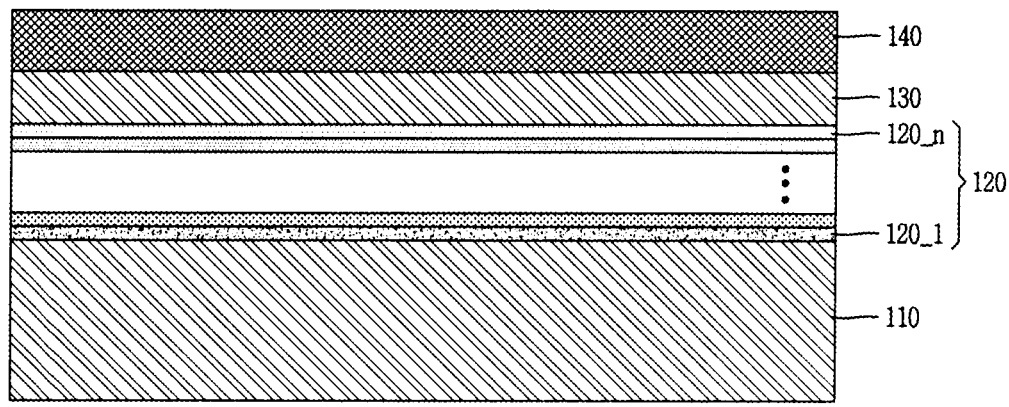

Next, after the growth of the GaN channel layer 130, the AlGaN barrier layer 140 which is an active layer for forming a 2 DEG layer of a heterostructure portion (FIG. 7D).

In accordance with one exemplary embodiment, the AlGaN barrier layer 140 may be grown in the composition ratio of 10% to 30%.

The thickness of the AlGaN barrier layer 150 may be in the range of 5 nm to 50 nm.

The AlGaN barrier layer 150 is a layer for forming 2 DEG by piezo-polarization and the like due to a lattice constant difference from the GaN channel layer 140. 2 DEG density may be decided depending on Al composition and thickness of the AlGaN barrier layer 150.

Figure 7E:
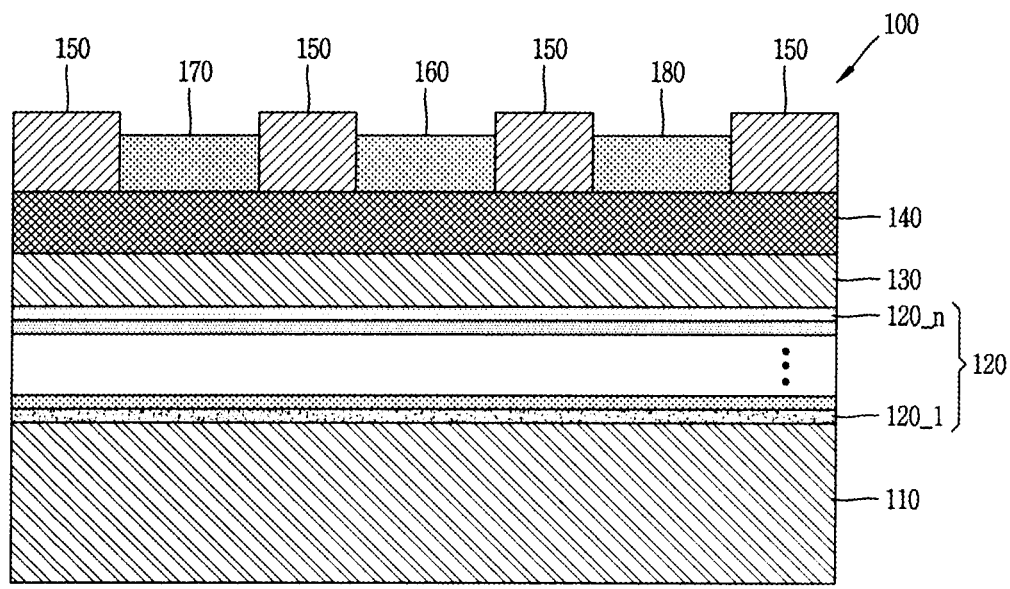

Next, an $Si_xNy$ 150 ($0 \le x$, $y \le 1$) may be grown on the grown AlGaN barrier layer 140 (see FIG. 7E).

A thickness of the $Si_xNy$ layer 150 may be in the range of 1 nm to 100 nm.

$SiH_4$ may be used as a raw material of the $Si_xNy$ layer 150, and $NH_3$ may be used as a raw material of N.

A silicon (Si) composition of the $Si_xNy$ layer 150 may be in the range of 1% to 80%.

Also, a source electrode 170, a drain electrode 180, and a gate electrode 160 may be formed (or deposited) on a partial region of the AlGaN barrier layer 140 (see FIG. 7E).

The source electrode 170, the drain electrode 180 and the gate electrode 160 may be deposited in a manner of depositing an Ohmic electrode using E-beams.

The present disclosure provides a nitride semiconductor power device having an AlGaN multilayer, which has changeable Al composition along a depositing direction, and $Si_xN_y$ layer, so as to minimize an increase in a leakage current and a decrease in a breakdown voltage, which are caused while fabricating a heterojunction type HFET device, and a fabricating method thereof.

According to the semiconductor device disclosed herein, the formation of the AlGaN multilayer and the $Si_xN_y$ layer may allow for a reduction of vertical leakage current paths and surface leakage current paths and for an increase in a breakdown voltage of the semiconductor device, resulting in an implementation of a high-power high-efficiency semiconductor device.

Also, a reduction of a 2 DEG due to the additional layer (for example, the AlGaN multilayer) may be prevented by the $Si_xN_y$ layer, which may result in an acquisition of a desired leakage current reduction result without a decrease in the 2 DEG characteristic.

The configurations and methods of the mobile terminal in the aforesaid embodiments may not be limitedly applied, but such embodiments may be configured by a selective combination of all or part of the embodiments so as to implement many variations.

What is claimed is:

1. A semiconductor device comprising:
   a buffer layer;
   an AlGaN multilayer on the buffer layer;
   a GaN channel layer on the AlGaN multilayer;
   an AlGaN barrier layer on the GaN channel layer to form a 2 DEG on the channel layer; and
   a $Si_xN_y$ layer (where 0<x, and y≤1) on a first region of the AlGaN barrier layer,
   wherein an aluminum (Al) composition of the AlGaN multilayer changes in a depositing direction in which the AlGaN multilayer is deposited,
   wherein a thickness of the AlGaN barrier layer is in a range of 5 nm to 50 nm,
   wherein the Al composition of the AlGaN barrier layer is in a range of 10% to 30%,
   wherein the $Si_xN_y$ layer is grown on the AlGaN barrier layer in an in-situ manner,
   wherein the Al composition of the AlGaN multilayer increases along the depositing direction of the AlGaN multilayer, and then decreases, starting from a specific Al composition, along the depositing direction of the AlGaN multilayer, and
   wherein a source electrode, a drain electrode, and a gate electrode are on a second region of the AlGaN barrier layer.

2. The device of claim 1, wherein the AlGaN multilayer comprises a plurality of AlGaN layers with different Al compositions, respectively,
   wherein a number of the plurality of AlGaN layers is between 1 to 30.

3. The device of claim 1, wherein the Al composition of the AlGaN multilayer is in a range of 1% to 70%.

4. The device of claim 1, wherein a thickness of the AlGaN multilayer is in a range of 1 nm to 300 nm.

5. The device of claim 1, wherein x which is a silicon (Si) composition of the $Si_xN_y$ layer is in a range of 0.01 to 0.8.

6. The device of claim 1, wherein a thickness of the $Si_xN_y$ layer is in a range of 1 nm to 100 nm.

7. The device of claim 1, wherein the GaN channel layer is doped with one of Mg dopant, C dopant, and Fe dopant, and
   wherein a concentration of the dopant is in a range of $3e^{17}/cm^3$ to $1e^{20}/cm^3$.

8. The device of claim 1, wherein the buffer layer is on a substrate, and
   wherein the substrate is one of Si, SiC, sapphire, and GaN.

* * * * *